United States Patent [19]
Esch, Jr. et al.

[11] Patent Number: 6,064,224
[45] Date of Patent: May 16, 2000

[54] CALIBRATION SHARING FOR CMOS OUTPUT DRIVER

[75] Inventors: Gerald L. Esch, Jr.; Guy H. Humphrey, both of Ft. Collins, Colo.

[73] Assignee: Hewlett—Packard Company, Palo Alto, Calif.

[21] Appl. No.: 09/127,775

[22] Filed: Jul. 31, 1998

[51] Int. Cl.[7] .................... H03K 17/16; H03K 19/003
[52] U.S. Cl. ........................... 326/30; 326/86; 326/82
[58] Field of Search .................... 326/30, 86, 82, 326/83, 90; 333/22 R

[56] References Cited

U.S. PATENT DOCUMENTS 5,254,883  10/1993  Horowitz et al. .................. 307/443
5,844,913  12/1998  Hassoun et al. .................. 371/21.1

*Primary Examiner*—Michael Tokar
*Assistant Examiner*—Anh Tran

[57] ABSTRACT

A circuit for matching the impedance of a first array of transistors to an external resistor is used to produce a first set of control signals. This first set of control signals is used to control another array of transistors to replicate the impedance of the first array of transistors. This replicated impedance is then used by another circuit for matching impedance to produce a second set of control signals that control an array of transistor of a different type to match the impedance of the first two array. The two sets of control signals may then be used as calibration signals for the pull-up and pull-down transistors of multiple output drivers.

10 Claims, 1 Drawing Sheet ately controlled to turn on, or remain off, according to a set of calibration signals such that the desired output impedance is achieved. Since the pull-up and pull-down transistors typically have different conductance and are sized differently, they usually require different sets of calibration signals. Normally, to generate these two set of calibration signals, two external resistors are used (one for the pull-up FETs and one for the pull-down FETs). This uses two calibration pins for each section of the chip that requires a different drive impedance. Since prudence would suggest having differently calibrated drivers for each side of the chip to compensate for process, voltage, and temperature fluctuations across a die as well as a different impedance for each type of signal, or group of signals, a large number of pins may have to be used as calibration pins. This increases the cost of the chip, and the assembly cost of any board the chip is used on.

CALIBRATION SHARING FOR CMOS OUTPUT DRIVER

FIELD OF THE INVENTION

This invention relates generally to digital output drivers for CMOS integrated circuits. More particularly, it relates to a circuit for calibrating the drive impedances of a group of CMOS output drivers.

BACKGROUND OF THE INVENTION

Dynamically calibrating the impedance of an output driver on an integrated circuit can have several advantages. It can reduce reflections on the output signal, reduce electromagnetic interference (EMI), reduce power dissipation, and reduce signal skew.

On a CMOS integrated circuit (IC), one way of controlling the impedance of an output driver is to split the pull-up transistor (typically a p-channel MOSFET (PFET) with it's source connected to the positive supply, VDD) and the pull-down transistor (typically a n-channel MOSFET (NFET) with it's source connected to the negative supply, GND) into multiple transistors. When the output driver is driving, each of these multiple transistors is then appropriately controlled to turn on, or remain off, according to a set of calibration signals such that the desired output impedance is achieved. Since the pull-up and pull-down transistors typically have different conductance and are sized differently, they usually require different sets of calibration signals. Normally, to generate these two set of calibration signals, two external resistors are used (one for the pull-up FETs and one for the pull-down FETs). This uses two calibration pins for each section of the chip that requires a different drive impedance. Since prudence would suggest having differently calibrated drivers for each side of the chip to compensate for process, voltage, and temperature fluctuations across a die as well as a different impedance for each type of signal, or group of signals, a large number of pins may have to be used as calibration pins. This increases the cost of the chip, and the assembly cost of any board the chip is used on.

Accordingly there is a need in the art for a way to reduce the number of calibration pins required for an impedance controlled CMOS output driver.

SUMMARY OF THE INVENTION

A preferred embodiment of the invention provides two sets of calibration signals but only uses one calibration pin and one external resistor. The invention may be implemented using standard CMOS circuits and may be used with existing controlled impedance output driver circuits.

An embodiment of the invention generates a first set of calibration signals from an external resistor. These calibration signals are then utilized to replicate on-chip the impedance of the external calibration resistor. This on-chip replicated impedance is then used by the invention to produce the second set of calibration signals without requiring a second external resistor or additional calibration pin.

Other aspects and advantages of the present invention will become apparent from the following detailed description, taken in conjunction with the accompanying drawing, illustrating by way of example the principles of the invention.

DETAILED DESCRIPTION OF THE PREFERRED EMBODIMENTS

Figure 1:
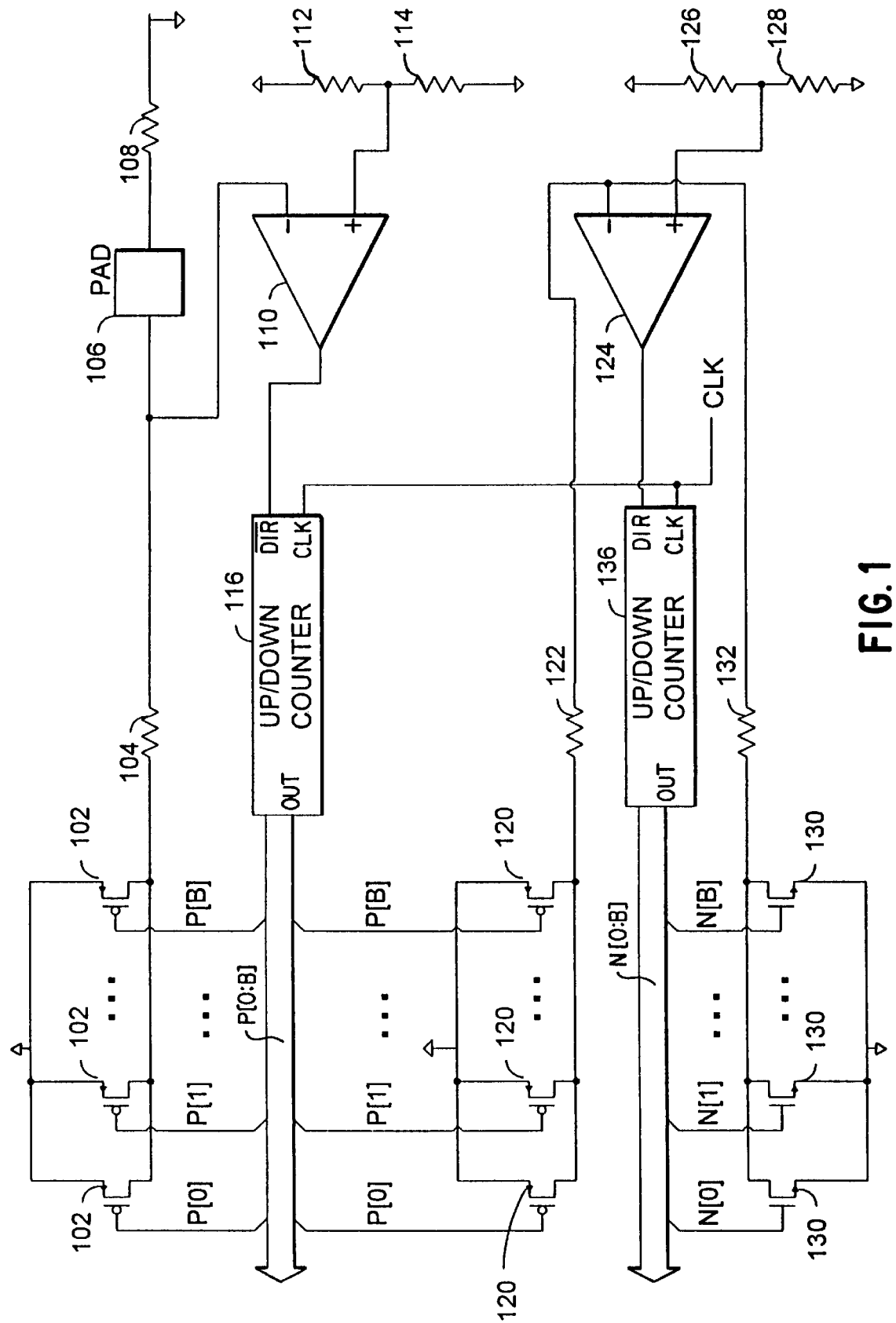
FIG. 1 is a schematic diagram of calibration circuit embodying the invention.

The calibration circuitry in FIG. 1 produces two sets of calibration signals (one for the pull-up transistors, one for the pull-down transistors) that can be used to program a group of output driver's impedances to match, or be some multiple of an external resistor. During normal operation, a PFET array 102 has current flowing through it. Each transistor of PFET array 102 is nominally equivalent in size of each transistor in the pull-up PFET array on a digitally controlled output driver. Current flows from positive supply VDD (which may be clean or dirty) through PFET array 102, through electrostatic discharge (ESD) protection resistor 104, out pad 106, through external resistor 108 to ground.

The impedances of the PFET array 102 and the ESD protection resistor 104 form a voltage divider with external resistor 108 to divide down the positive supply voltage at the pad 106 node. This node is an input to the inverting terminal of analog comparator 110. The non-inverting input of analog comparator 110 is connected to a voltage divider formed with resistors 112 and 114. Resistors 112 and 114 are on-chip resistors and are connected in series between the positive supply and the negative supply with the intermediate node connected to the non-inverting input of analog comparator 110. In a preferred embodiment, resistors 112 and 114 have the same value so that the voltage at the non-inverting input of analog comparator 110 is VDD/2. The output of analog comparator 110 is connected to the DIR input of digital up/down counter 116 which controls the direction that up/down counter 116 counts. Up/down counter 116 is a saturating counter so that it does not roll over from it's highest output to the lowest and visa-versa. Up/down counter 116 increments or decrements the binary value on its outputs according to the state of DIR when the clock input, CLK, is strobes. The outputs of up/down counter 116 are connected to signals P[0:B], each of which is connected to the gate of one of the transistors of PFET array 102. B is an arbitrary number setting the resolution of the calibration circuit where B+1 is the number of transistors in PFET array 102. In a preferred embodiment, the sizes of each transistor in PFET array 102 are scaled to correspond to the significance of the bit of P[0:B] connected to it's gate. For example, if P[N] controls a FET with conductance G, then P[N+1] controls a FET with conductance 2*G.

Up/down counter 116 counts up when the inverting input of comparator 110 is higher than the non-inverting input of analog comparator 116. This turns off more of the transistors of PFET array 102 increasing the impedance of PFET array 102. When the inverting input of comparator 110 is lower than the non-inverting input of analog comparator 110, up/down counter 116 counts down turning on more of the transistors of PFET array 102 decreasing the impedance of PFET array 102. This feedback system stabilizes when the impedance of PFET array 102 and ESD protection resistor 104 nearly matches the resistance of external resistor 108.

The gates of PFET array 120 are also connected the outputs of up/down counter 116, P[0:B], so that the impedance of PFET array 120 nearly matches that of PFET array 102. The sources of the transistors in PFET array 120 are connected to the positive supply. During operation, current flows through the on transistors of PFET array 120, through resistor 122, resistor 132, and the on transistors of NFET array 130. Each transistor of NFET array 130 is nominally equivalent in size of each transistor in the pull-down NFET array on a digitally controlled output driver. Resistors 122 and 132 are chosen to match the ESD protection resistors of the output drivers and resistor 104. The impedances of PFET array 120 and resistor 122 form a voltage divider between the positive supply and ground with the impedances of resistor 132 and NFET array 130. The intermediate node of this voltage divider is connected to the inverting input of analog comparator 124. The non-inverting input of analog comparator 124 is connected to an on-chip voltage divider formed from resistors 126 and 128 between the positive supply and ground.

The output of analog comparator 124 is connected to the DIR input of up/down counter 136. The output signals of up/down counter 136 are connected to signals N[0:B]. These signals are connected to the gates of the transistors of NFET array 130. When the inverting input of comparator 124 is lower than the non-inverting input of analog comparator 124, up/down counter 136 counts down turning off more of the transistors of NFET array 130 increasing the impedance of NFET array 130. When the inverting input of comparator 124 is higher than the non-inverting input of analog comparator 124, up/down counter 136 counts up turning on more of the transistors of NFET array 130 decreasing the impedance of NFET array 130. This feedback system stabilizes when the series impedance of NFET array 130 and resistor 132 nearly matches the series resistance of resistor 122 and the on transistors of PFET array 120. This results in the impedance of NFET array 130 matching the resistance of external resistor 108.

When the system is stable around one or two values, the impedance PFET array 120 nearly matches the impedance of external resist or 108. PFET array 120 is controlled by P[0:B]. Therefore, the signals P[0:B] can be distributed to the output drivers to control their pull-up impedance. Likewise, when the system has stabilized, the impedance of NFET array 130 also nearly matches the impedance of external resistor 108. NFET array 130 is controlled by the signals N[0:B]. Therefore, the signals N[0:B] can be distributed to the output drivers to control their pull-down impedance. This calibration process is continuous and transparent to normal chip operation. The output drivers read new pull-up/pull-down calibration values off the calibration signals when they pull-up/pull-down, respectively.

Although a specific embodiment of the invention has been described and illustrated, the invention is not to be limited to the specific forms or arrangements of parts so described and illustrated. The invention is limited only by the claims.

What is claimed is:

1. A calibration circuit, comprising:
    a first set of calibration signals generated by a first feedback system;
    a second set of calibration signals generated by a second feedback system;
    a first transistor array wherein said first transistor array is controlled by said first set of calibration signals to match the impedance of a first resistor; and,
    a second transistor array wherein said second transistor array is controlled by said second set of calibration signals to match the impedance of a third transistor array wherein said third transistor array is controlled by said first set of calibration signals.

2. The calibration circuit of claim 1, wherein said third transistor array is sized such that when said third transistor array is controlled by said first set of calibration signals the impedance of said third transistor array nearly matches the impedance of said first resistor.

3. The calibration circuit of claim 2 wherein said first feedback system comprises:

a first voltage divider comprised of said first transistor array and said first resistor;
    a first comparator wherein said first comparator compares a first divided node of said first voltage divider with a first reference voltage to produce a first comparator output; and,
    a first up/down counter wherein said first up/down counter counts a first binary output up and down according to said first comparator output and said first binary output is coupled to said first set of calibration signals.

4. The calibration circuit of claim 3 wherein said second feedback system comprises:

a second voltage divider comprised of said second transistor array and said third transistor array;
    a second comparator wherein said second comparator compares a second divided node of said second voltage divider with a second reference voltage to produce a second comparator output; and,
    a second up/down counter wherein said second up/down counter counts a second binary output up and down according to said second comparator output and said second binary output is coupled to said second set of calibration signals.

5. The calibration circuit of claim 4 wherein said first transistor array is comprised of PFETs and wherein said second transistor array is comprised of NFETs and wherein said third transistor array is comprised of PFETs.

6. A method of producing a first set of calibration signals and a second set of calibration signals, comprising:

producing said first set of calibration signals that control a first transistor array to match the impedance of a first resistor;
    producing said second set of calibration signals that control a second transistor array to match the impedance of a third transistor array; and,
    applying said first set of calibration signals to said third transistor array to control said third transistor array to match the impedence of said first transistor array.

7. The method of claim 6 wherein said first transistor array is comprised of PFETs and wherein said second transistor array is comprised of NFETs and wherein said third transistor array is comprised of PFETs.

8. A calibration circuit, comprising:

a first feedback system producing a first set of calibration signals that control a first transistor array to match the impedance of a resistor;
    a second feedback system producing a second set of calibration signals that control a second transistor array to match a multiple of the impedance of said first transistor array.

9. The calibration circuit of claim 8, further comprising:

a third transistor array controlled by said first set of calibration signals that is used by said second feedback system to replicate the impedance of said first transistor array.

10. The calibration circuit of claim 9, wherein said second feedback system uses said second transistor array and said third transistor array in a voltage divider to test whether the impedance of said second transistor array nearly matches the impedance of said third transistor array.

\* \* \* \* \*